United States Patent
Gopal et al.

(10) Patent No.: US 10,135,461 B2
(45) Date of Patent: Nov. 20, 2018

(54) SYSTEMS, METHODS, AND APPARATUSES FOR DECOMPRESSION USING HARDWARE AND SOFTWARE

(71) Applicant: Intel Corporation, Santa Clara, CA (US)

(72) Inventors: Vinodh Gopal, Westborough, MA (US); James D. Guilford, Northborough, MA (US); Sean M. Gulley, Boston, MA (US); Kirk S. Yap, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,749

(22) Filed: Sep. 25, 2015

(65) Prior Publication Data
US 2017/0093424 A1 Mar. 30, 2017

(51) Int. Cl.
*H03M 7/40* (2006.01)
*H03M 7/30* (2006.01)

(52) U.S. Cl.
CPC ....... *H03M 7/3086* (2013.01); *H03M 7/6005* (2013.01); *H03M 7/6017* (2013.01)

(58) Field of Classification Search
CPC .......... H03M 7/425; H03M 7/40; H03M 7/30; H03M 7/3059; H03M 7/4006; H03M 7/3082; H03M 7/42; H03M 13/09; H03M 7/3084
USPC ..................................... 341/65, 67, 106, 107
See application file for complete search history.

(56) References Cited

U.S. PATENT DOCUMENTS

| | | | | |
|---|---|---|---|---|
| 5,325,092 A * | 6/1994 | Allen | ..................... | H03M 7/425 341/65 |
| 5,363,097 A * | 11/1994 | Jan | ......................... | H03M 7/425 341/63 |
| 5,583,500 A * | 12/1996 | Allen | .................. | H03M 7/4006 341/107 |
| 5,603,012 A * | 2/1997 | Sotheran | ............... | G06F 9/3867 370/450 |
| 5,617,089 A * | 4/1997 | Kinouchi | ................ | G06T 9/005 341/63 |
| 6,021,198 A * | 2/2000 | Anigbogu | ........... | H03M 7/3086 341/51 |
| 6,313,767 B1 * | 11/2001 | Ishizuka | ............... | H03M 7/425 341/67 |

(Continued)

OTHER PUBLICATIONS

Collet Y., "LZ4 explained," In: RealTime Data Compression, May 26, 2011 downloaded from http://fastcompression.blogspotin/2011/05/lz4-explained.html, 11 pages.

(Continued)

*Primary Examiner* — Linh Nguyen
(74) *Attorney, Agent, or Firm* — Nicholson De Vos Webster & Elliott LLP

(57) ABSTRACT

Detailed herein are embodiments of systems, methods, and apparatuses for decompression using hardware and software. In hardware, an input buffer stores incoming input records from a compressed stream. A plurality of decoders decode at least one input record from the input buffer out output an intermediate record from the decoded data and a subset of the plurality of decoders to output a stream of literals. Finally, a reformat circuit formats an intermediate record into one of two types of tokens.

16 Claims, 21 Drawing Sheets

(56) References Cited

U.S. PATENT DOCUMENTS

| | | | |
|---|---|---|---|
| 6,934,903 B1 * | 8/2005 | Keltcher | G11C 7/1006 |
| | | | 714/763 |
| 7,283,591 B2 * | 10/2007 | Ruehle | H04B 1/66 |
| | | | 341/65 |
| 8,125,357 B1 | 2/2012 | Hamlet et al. | |
| 2002/0101367 A1 * | 8/2002 | Geiger | H03M 7/30 |
| | | | 341/51 |
| 2003/0063578 A1 * | 4/2003 | Weaver | H04J 3/17 |
| | | | 370/289 |
| 2005/0104753 A1 | 5/2005 | Dror et al. | |
| 2009/0219183 A1 * | 9/2009 | Sakaguchi | H03M 7/4006 |
| | | | 341/107 |
| 2015/0113220 A1 | 4/2015 | Amit et al. | |

OTHER PUBLICATIONS

International Search Report and Written Opinion for Application No. PCT/US2016/053504, dated Jan. 2, 2017, 15 pages.

* cited by examiner

| 18 BITS | | | | | 7 BITS | 11 BITS | |
|---|---|---|---|---|---|---|---|
| 39 | 22 | 21 | 20 | 19 | 18 | 17 | 11 | 10 | 0 |
| SRC OFFSET | | LITERAL | UPDATE | LONG | OVERLAP | LEN/16 | DST OFFSET |

| SRC OFFSET | 0 | 0 | 0 | 0 | LEN/16 | DST OFFSET |
| SRC OFFSET | 0 | 0 | 0 | 1 | LEN/16 | DST OFFSET |
| SRC OFFSET | 1 | 0 | 0 | 0 | LEN/16 | DST OFFSET |
| DELTA SRC OFFSET | 0 | 1 | 0 | 0 | 0 | DELTA DST OFFSET |

| SRC OFFSET | 1 | 0 | 1 | 0 | 0 | DST OFFSET |
| LEN (NOT DIVIDED BY 16 (32 BITS)) | | | | | | |

| SRC OFFSET | 0 | 0 | 1 | 0 | LEN/16 | DST OFFSET |
| SRC OFFSET (33 BITS) | | | | | | |

FIG. 4

```
.loop
mov data, [decoded]
add decoded, 5 // add 5 bytes to ptr to decoded stream mov tmp2, data
shl tmp2, 24
sar tmp2, 24+SRC_OFFSET // tmp2 has "signed" source-
offset test data, (LONG | UPDATE | OVERLAP | LEN16)
jnz .long_or_update_or_overlap // catch all rare cases,
overall rare branch and jump to slow path mov tmp, output //base ptr of uncompressed stream
test data, LITERAL //is it a literal? From token.
cmovnz tmp, input // no bad branch w/ CMOV selecting
src pointer; input is original compressed vmovdqu xtmp, [tmp + tmp2] // tmp is either input/
output base pointer; tmp2 is the signed offset => source
pointer and data, OUT_OFFSET
vmovdqu [output + data], xtmp // single 16-byte fast copy .end_loop
      cmp decoded, decoded_end
      jb .loop
```

FIG. 6

| FAST PATH | NON-ZERO LEN1 801 | ... | NON-ZERO LENGTH 8 803 | SOURCE PTR1 805 | ... | SRCPTR8 807 |

| SLOW PATH | BYTE=0 809 | LENGTH 811 | SOURCE POINTER 1 813 |

FIG. 8

FIG. 13
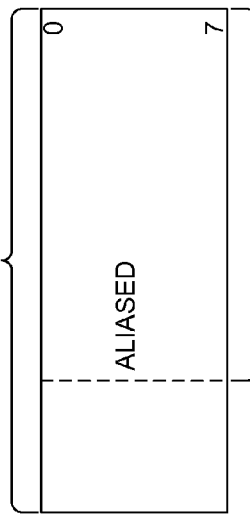
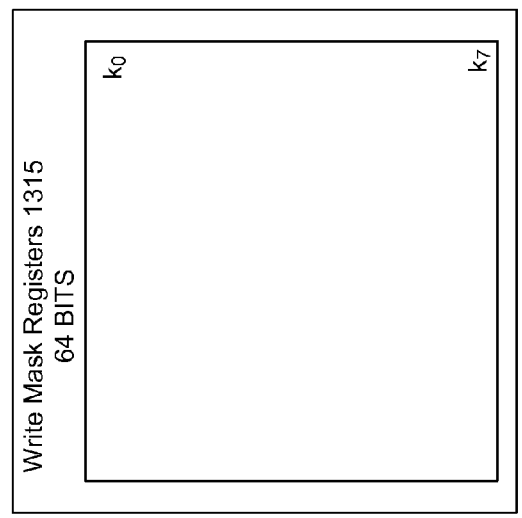
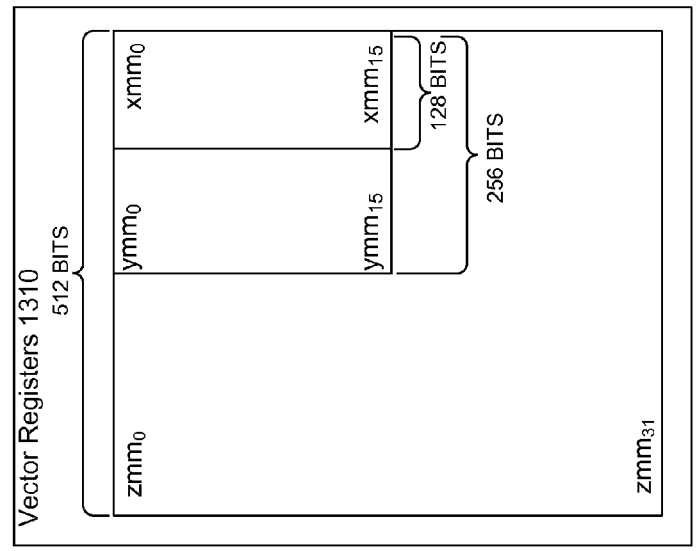

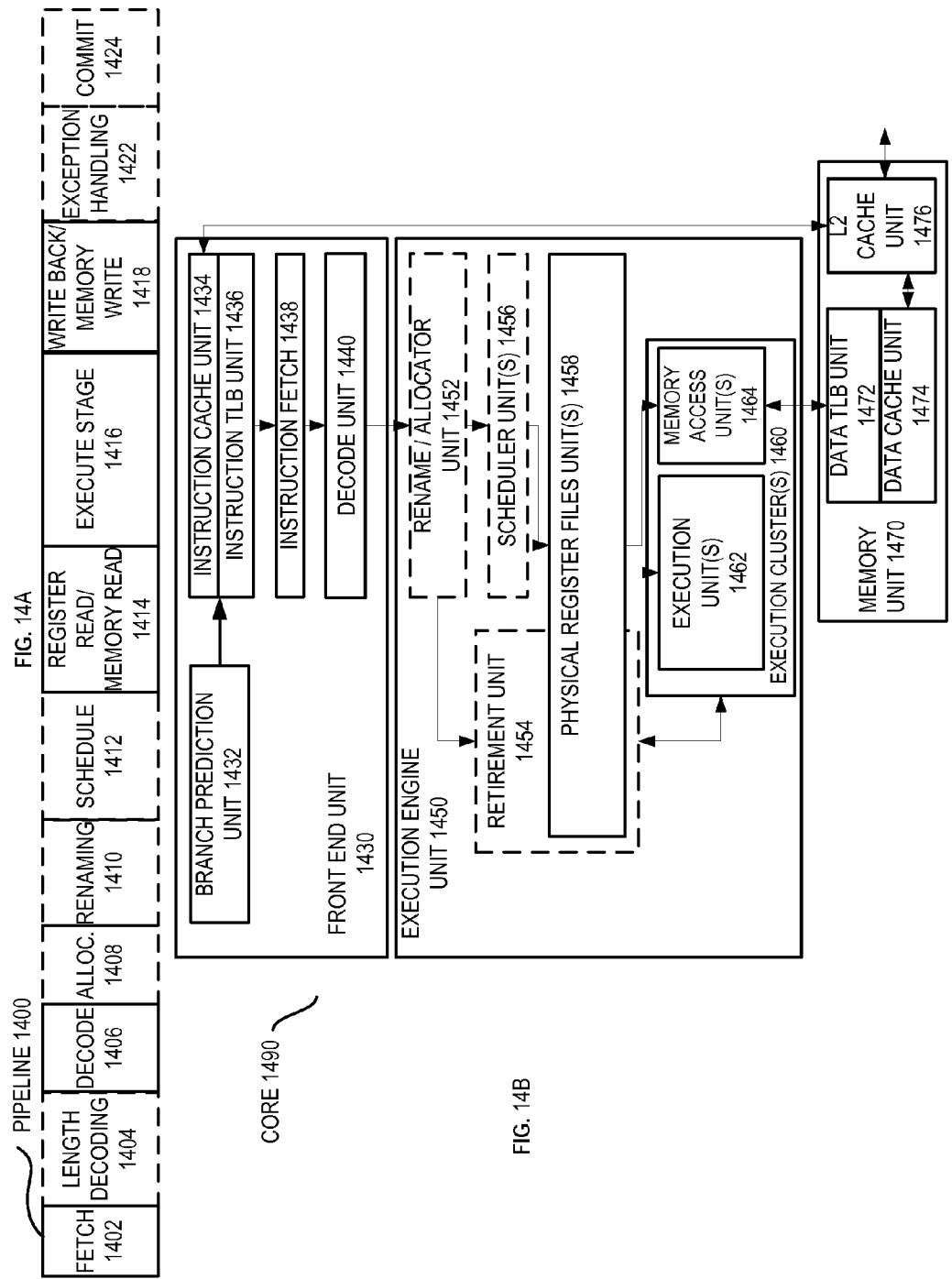

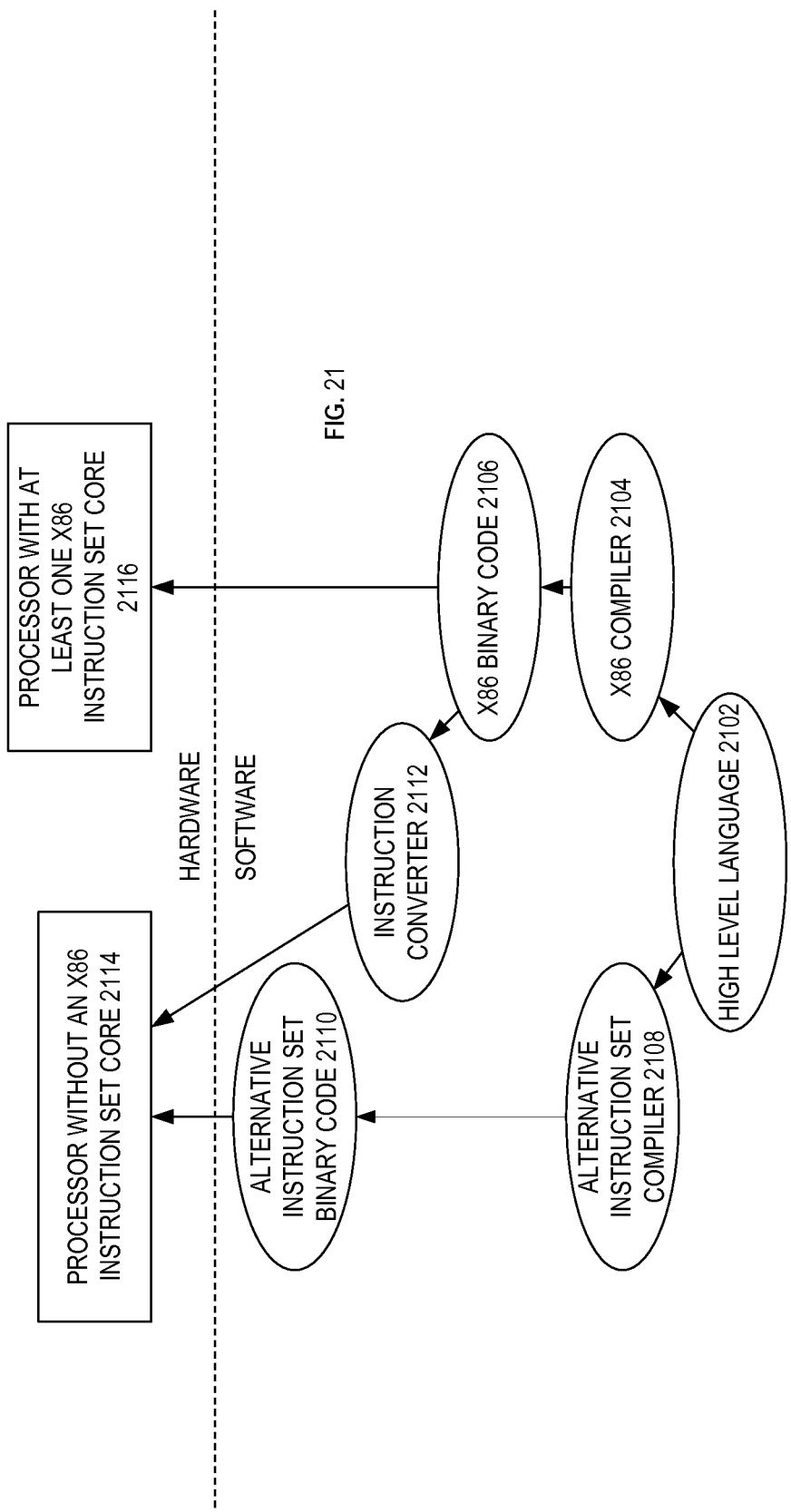

SYSTEMS, METHODS, AND APPARATUSES FOR DECOMPRESSION USING HARDWARE AND SOFTWARE

FIELD

The various embodiments described herein relate to decompression techniques.

BACKGROUND

Snappy is one algorithm in the LZ77 family that is widely used in applications such as Hadoop Compression, BTRFS file-system, in data center usages such as index-servers and is also enabled in the some browsers. In these usages, decompression latencies are critical to system performance.

BRIEF DESCRIPTION OF THE DRAWINGS

The present invention is illustrated by way of example and not limitation in the figures of the accompanying drawings, in which like references indicate similar elements, and in which:

FIG. 4 illustrates an embodiment of a token format and tokens output from the accelerator.

FIG. 6 illustrates an example of fast path code.

FIG. 8 illustrates an embodiment of a fast and slow path token format.

FIG. 13 is a block diagram of a register architecture according to one embodiment of the invention.

FIG. 14A is a block diagram illustrating both an exemplary in-order pipeline and an exemplary register renaming, out-of-order issue/execution pipeline according to embodiments of the invention.

FIG. 14B is a block diagram illustrating both an exemplary embodiment of an in-order architecture core and an exemplary register renaming, out-of-order issue/execution architecture core to be included in a processor according to embodiments of the invention.

FIG. 21 is a block diagram contrasting the use of a software instruction converter to convert binary instructions in a source instruction set to binary instructions in a target instruction set according to embodiments of the invention.

DETAILED DESCRIPTION

Figure 1:
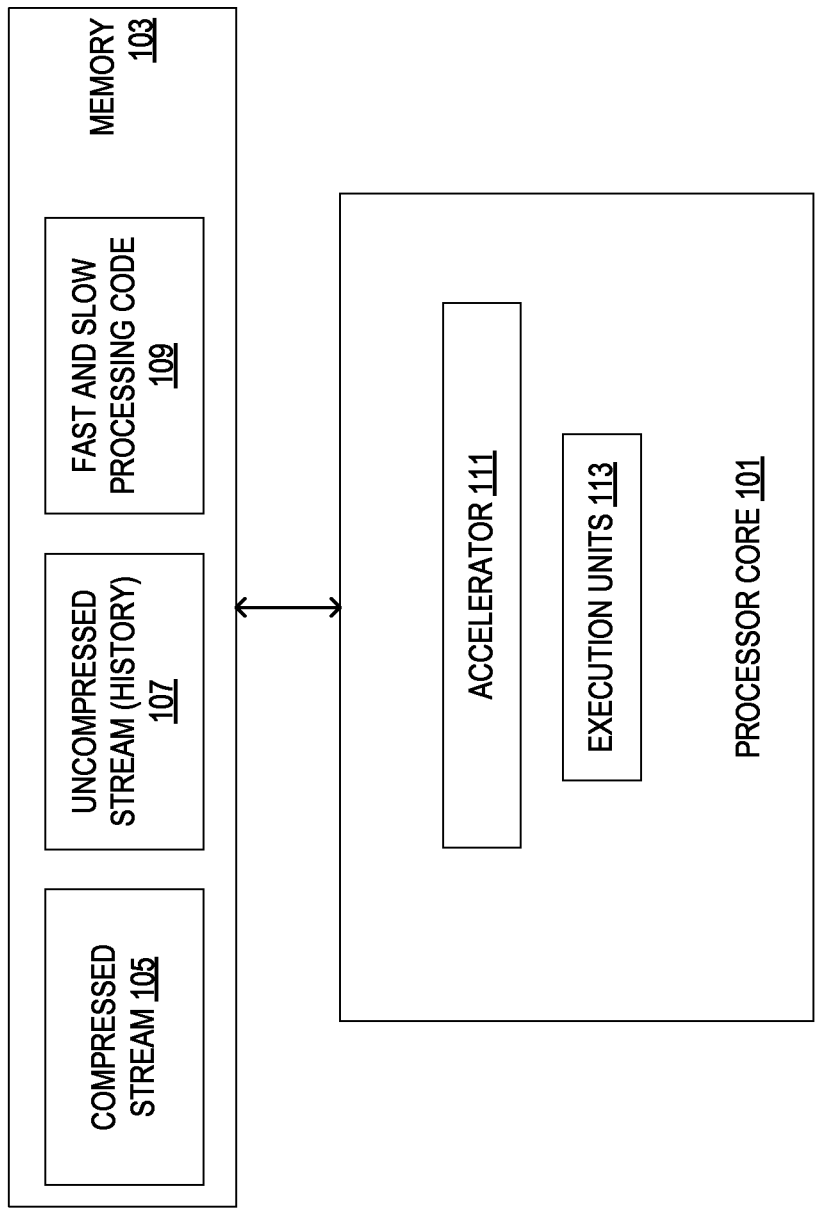
FIG. 1 illustrates an embodiment of system for accelerated decompression.

In the following description, numerous specific details are set forth. However, it is understood that embodiments of the invention may be practiced without these specific details. References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Detailed below are embodiments to speed up decompression (e.g., of LZ77-based compression algorithms), using an efficient and novel partitioning of the computations between fixed-function hardware and software. Many of the embodiments below discuss the LZ77 "Snappy" algorithm, but apply equally well to other compression techniques in this family (e.g. LZF, LZ4) that are based on (similar) encoding formats. In general, LZ77 compression algorithms find repeated substrings and replace them with backward references (relative distance offsets). The compressed data consists of a series of elements of two types: literal bytes and pointers to replicated strings, where a pointer is represented as a pair <length, backward distance offset>.

The Snappy format consists of symbols that either represent a run of literal bytes, or a reference. The encoding starts with a tag or control byte that contains information on the type of symbol, length of literals or references, as well as some bits of the distance offset. The tag byte is followed by literals, or 1 or 2 distance offset bytes. In some (rare) cases of large history buffers or very long literal strings, additional bytes are present.

The decompression process consists of two main steps: 1) parse the input stream into tokens (literals or LZ77-copies) and 2) copy a specified number of bytes to an output stream. Current software methods to implement LZ77 decompression are limited by bad conditional data-dependent branches, load latencies and a number of instructions that affect the critical path of decoding a symbol. Since decompression is a serial process, the critical path is usually related to how fast one can resolve and start to process the next symbol.

In the embodiments discussed below, the first step above is performed in fixed-function hardware and the second step is done by software on a conventional processor. The focus below is on a critical portion of the LZ77 decompression and splits the problem efficiently between fixed-function hardware just for front-end parsing, and software for data copies. An intermediate token stream is defined that is very friendly for software performance by eliminating low confidence data-dependent branches, having a small number of instructions in the critical loop, and eliminating the current software critical path to get to the next symbol decode (by defining fixed-length tokens).

The post-processing software computation is split into a fast and slow path, and ensures the fast path achieves the highest speed on conventional cores. FIG. 1 illustrates an embodiment of system for accelerated decompression. In memory 103 (either volatile memory such random access memory (RAM) or non-volatile storage such as disk), a compressed LZ77 stream 105, an uncompressed LZ77 stream 107, and fast and slow processing code 109 are stored. The compressed stream 105 is an input into the accelerator 111 comprising an LZ77 encoded file. The uncompressed stream 107 is an output of the accelerator 111 and execution units 113. Typically, this stream includes a history of what has already been decoded. Code for processing the stream to direct both the accelerator 111 and execution units 113 is stored in fast and slow processing code 109. An example of this code is found in FIG. 6 to be discussed later.

The accelerator 111 generates fixed-length (e.g., 5-byte) tokens that represent a copy from history/output buffer or a copy from input stream (i.e., a set of literals). At times below, the accelerator 111 may be referred to as front-end hardware. The accelerator 111 reads in a LZ77 stream (compressed) and outputs a stream of tokens (i.e., not including the literal data) in a fixed-length format. The execution units 113 of the processor core 101 act as a back-end and use the tokens, the original stream, and the output stream (history) to generate the decoded output.

Figure 2:
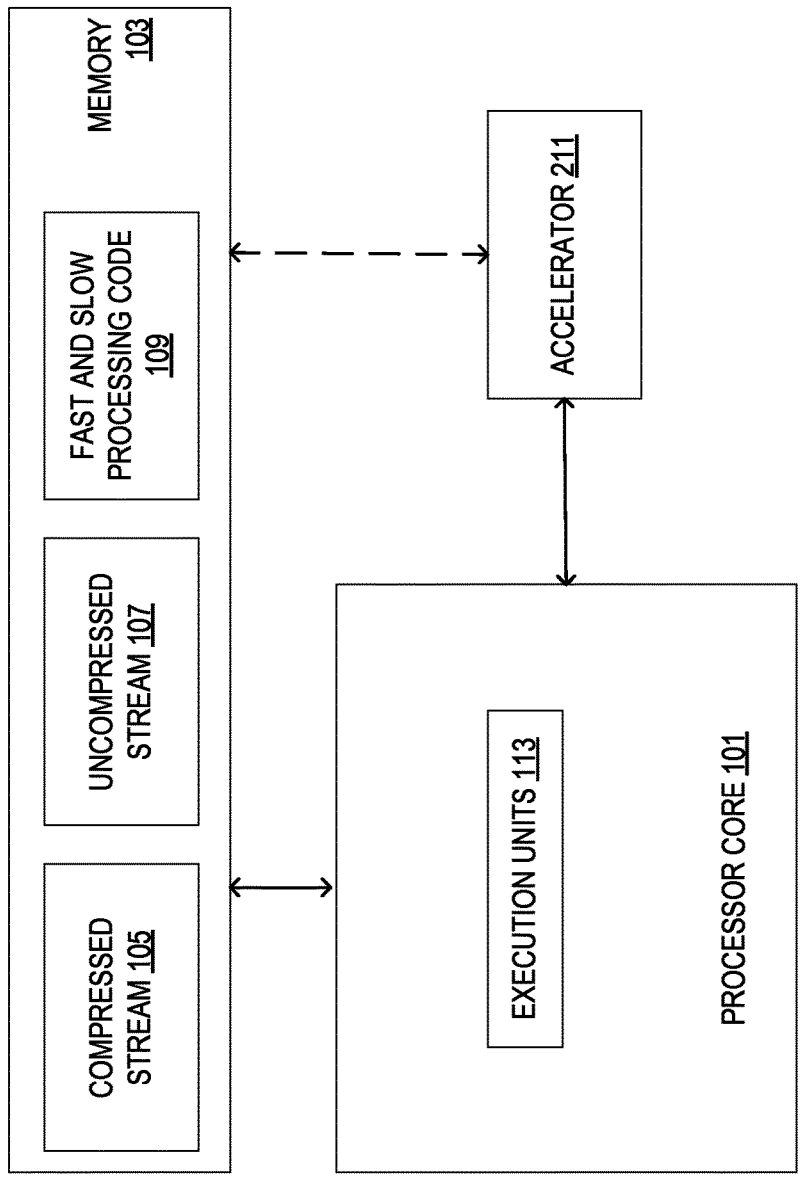
FIG. 2 illustrates an embodiment of system for accelerated decompression.

FIG. 2 illustrates an embodiment of system for accelerated decompression. In this example, the components are the same as in the previous figure, however, the accelerator 211 is outside of the processor core 101.

The accelerator output consists of a stream of fixed-length (5-byte) tokens. Most of the time, a LZ77 record will generate a single token. In rare instances, a record will generate two tokens which is handled by an exception case "slow-path" in the processor code. The token stream provides two offsets that are used by the processor code as offsets with respect to a source and destination base register for the mem-copy operations. Rather than have the code increment the addresses at each step in the iteration, the hardware accelerator provides a growing offset for the software's base address. At some point, when the offset becomes too large, an update token is sent to increment the base registers in the processor code. These update events are infrequent and do not affect performance or size of the intermediate stream appreciably; on the other hand they improve the performance of each iteration of the code as it is a tight/small loop.

Figure 3:
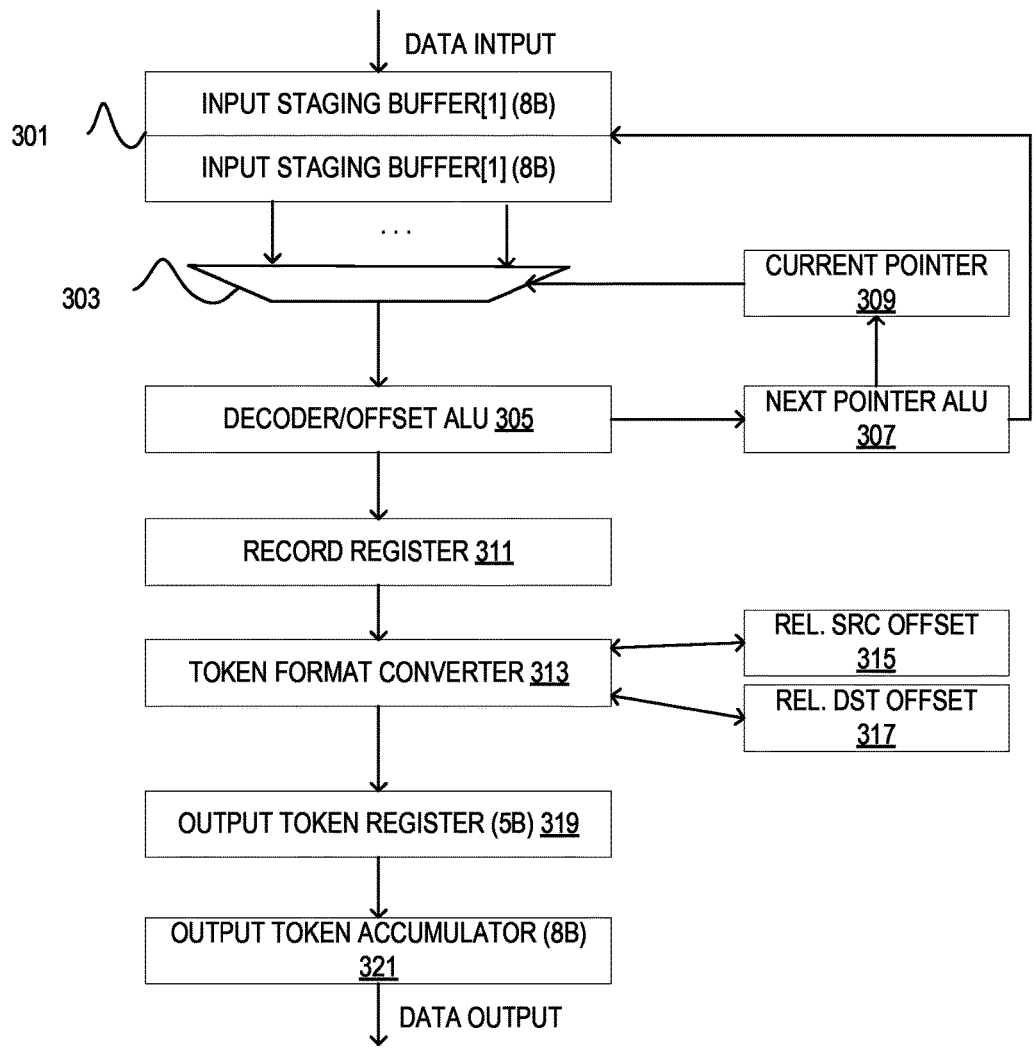
FIG. 3 illustrates an embodiment of a hardware accelerator.

FIG. 3 illustrates an embodiment of a hardware accelerator. For example, accelerator 111 or 211. In the illustrated example, there are two input staging buffers 301 each of 8 bytes in size. These input buffers 301 receive compressed data (such as Snappy compressed data). Of course, other buffers sizes may be used. The buffers 301 are advanced based upon a pointer provide by a decoder 305.

A selector 303 selects at least one byte from the input buffers based upon a current pointer in the decoded stream. In an embodiment, the selector 303 is an 8:1 multiplexor that selects up to 5 bytes from the buffers 301.

The decoder/offset ALU 305 decodes the selected bytes to determine several pieces of data including one or more of if the decoded data is a literal, symbol, causes an overlap condition (where the input and output streams overlap), the size of the LZ77 record (to be used in an update sync of the source and destination base registers), the length of the literal or symbol, and offsets for the literal or symbol. The decoder 305 also determines a next pointer for moving the buffer 301 along and to be used by the selector 303. The output of the decoder is stored in a LZ77 record register 311 in some embodiments.

An LZ77 to token converter 313 takes the output of the decoder 305 (and register 311) to generate a fixed-length token (e.g., 5 byte) including some of the decoded data. The converter 313 also takes in and updates relative source and destination offsets stored in base registers 315 and 317.

An output token register 319 stores a token until an output token accumulator 321 is ready to send it out.

FIG. 4 illustrates an embodiment of a token format and tokens output from the accelerator. 401 illustrates an overall format that includes fields for source offset, literal, update, long, overlap, length, and destination offset. Exemplary sizes and bit positions are shown, however, different sizes or placements may be used. Additionally, the field for length ("len/16") is the length in 16 byte blocks and is in some embodiments "floor((len−1)/16)" as there is should be at least one block (unless on the slow path).

The destination/output address is specified as a destination offset ("dst_offset") from a base pointer (where the base pointer is periodically updated with "update" records). This means that other than the case where the output of a copy is the input for the next record's copy, there are no dependencies between iterations In most embodiments, the length of item to be copied is provided rounded up to 16-bytes. This enables a fast simple copy in processor code, instead of a slow byte-by-byte copy. However, in LZ77, one can have overlapping copies from a distance that is too close to the current pointer, which will need a slower copy. The accelerator detects these cases and sets the "overlap" bit flag. The length for literals in LZ77 (such as Snappy) encoding can be up to $2^{32}$ (4 GB), but most of the time they will be <61 bytes. The length for symbols is limited to 64 (i.e. <=64), but the distance back can be as large as the history window.

In the illustrated example, all of the copies are expressed as multiple of 16 bytes, however, other size may be used in some embodiments. The destination address will only advance by the length of the reference/literal-run, but it is typically efficient to copy larger fixed chunks as that is faster than variable byte-by-byte copies.

The source offset ("src_offset") is a signed value. For a literal, it will normally be a positive value (with respect to an address register pointing to the original input stream). For a symbol, it would initially be a negative value with respect to the output pointer (i.e., an address register pointing to the output stream), but as output is written (without changing the output pointer), it could become a positive value.

Update indicates that the input and output address are to be updated by a delta, this synchronizes source and data pointers and is typically a large amount to add). Literal indicates if what is being processed is a literal or a symbol. Long indicates if there is large, uncompressible data that should be rare and calls for the slow path.

403 illustrates an example of a token for a symbol wherein the source offset is with respect to the output address. This means to copy the symbol with respect to the output pointer.

405 illustrates an example of a token for a symbol wherein the source offset is with respect to the output address where the copy output overlaps the input.

407 illustrates an example of a token for a literal wherein the source offset is with respect to the input address of the original compressed stream buffer. This means to copy the literal from the buffer.

409 illustrates an example where an update of the source and destination offsets are to be made and the delta for those updates.

411 illustrates an example of a token indicating a long literal where the length of the literal string is very large. There are two issues with this. The first is that the length/16 overflows 7 bits, so a larger length field is needed (an uncompressible amount of data). At the start of the copy operation, the offset fields (along with their associated base registers) are reasonably sized. The second issue is that after a copy operation, the output pointer has advanced by a "large" amount (i.e. an amount that could be significantly greater than what can be incremented by a normal "update" operation). Similarly, the base pointer into the original input stream will also have advanced by a "large" amount. To deal with this, there is a large value that is to be added to both of these base pointers after the copy operation completes (an implicit large update).

In the long literal case, the size is given (not the size/16). This determines the amount of data to be copied and is also the value to be added to the input and output base registers. In some embodiments, has a 17-bit input offset and an 8-bit length field. In some embodiments, the fixed-length of the tokens is defined to 8-bytes.

413 indicates a long symbol where the source offset cannot be expressed in the width of the field, even after an update.

Figure 5:
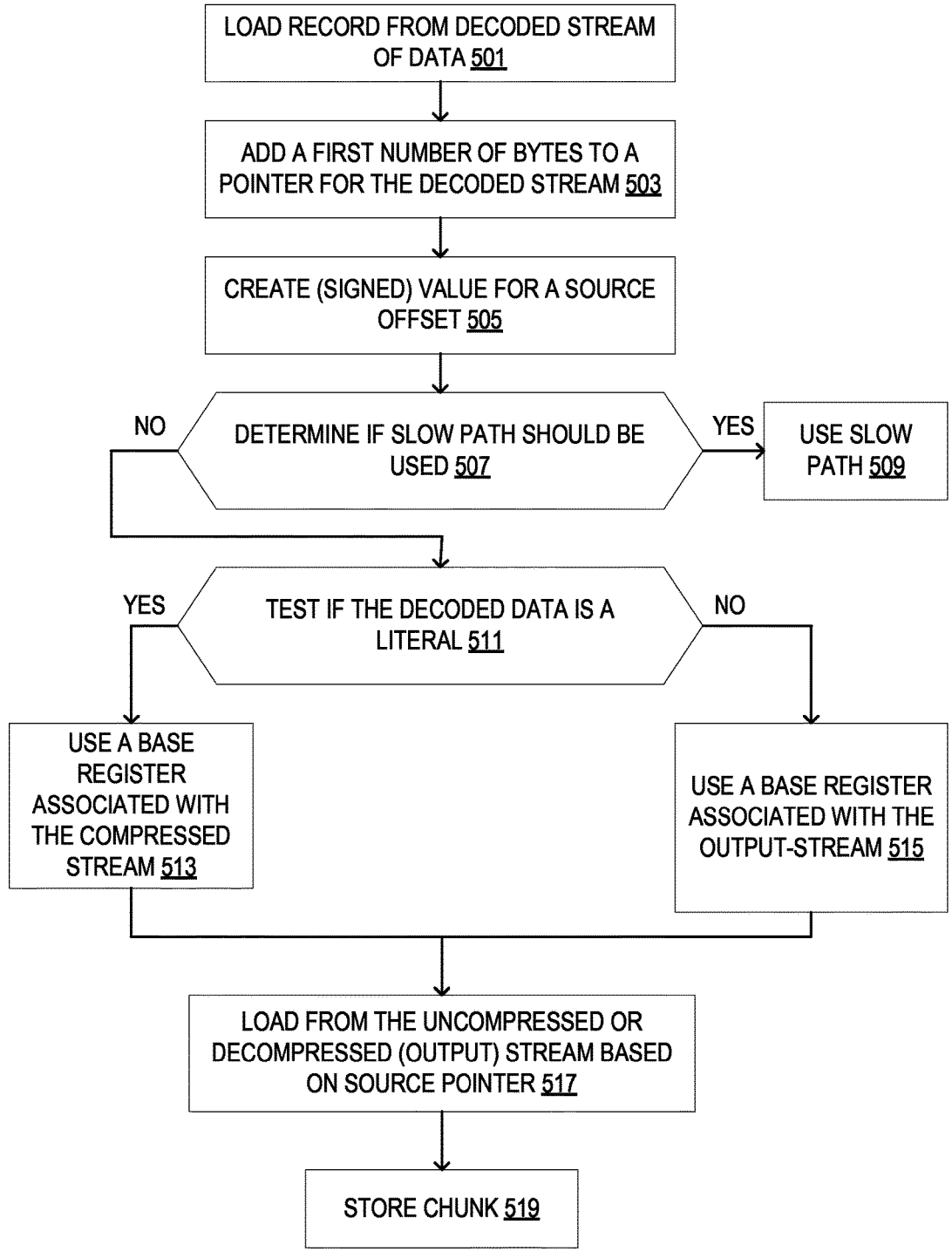
FIG. 5 illustrates an embodiment of a decompression method.

FIG. 5 illustrates an embodiment of a decompression method. This method works in conjunction with the above described accelerator and consumes the output of that accelerator.

At 501, a record is loaded from a decoded stream. For example, a record is loaded from a LZ77 stream such as a Snappy stream. A first number of bytes are added to the loaded record pointer for the decoded stream at 503. For example, 5 bytes are added to the pointer of the loaded record. These steps allow for a record to be loaded from a decoded stream.

At 505, a signed value for a source offset is created.

A determination of if a slow path (not using the hardware accelerator) is to be used is made at 507. This determination uses a token output from the hardware accelerator to determine if a condition exists that does not allow for efficient use of the hardware accelerator. For example, is there a long, update, or overlap condition. If there is, then the slow path is used at 509, but this should be a rare occurrence.

If there is not such a condition, then at 511 a determination of if the decoded data is a literal is made. This information comes from the token supplied by the hardware accelerator. If it is a literal, then the source pointer for the data uses a base register storing as base pointer associated with the compressed (original) stream at 513. The base pointer is added to the signed source offset to create a loading address. If it is not a literal, then the source pointer is the base pointer associated with the decompressed output plus the signed source offset into the decompressed (output) stream at 515. Note that these base registers are present in either the accelerator or processor core.

At 517, the data from the decompressed or compressed stream is loaded based upon the source pointer at 517. The loaded data is stored as a chunk, e.g., 16 bytes, at 519. This method repeats until the compressed stream has been processed.

FIG. 6 illustrates an example of fast path code. The loop is performed for every symbol. The first two instructions (mov and add) load a record from a decoded stream. The next three instructions provide a signed value for the source offset. The next two instructions test for the conditions included in the token. If there are issues that prevent the fast path from being effective (long, update, or overlap set to 1, then the slow path is jumped to. The next three instructions (mov, test, and cmovnz) potentially switch the source pointer. Vmovdqu is a load, and the instructions that follow to the end of the loop are used to store a 16-byte copy.

Heterogeneous Decompression Processing

Detailed above is a front-end that generates fixed-length (5-byte) tokens representing: copy N bytes from history/output buffer and copy N bytes from input stream (i.e., a set of literals). This enabled processor code to be branch-free and simply use a move instruction to load a source pointer for the copy.

Unfortunately, this is not always ideal for all compression algorithms. For example, in a byte-oriented format that does not encode a set of literals, but encodes just a single literal byte for each position where no match was found it may be less than idea. Whereas the simple fixed 5-byte token could represent a single literal, 1 token per literal would be generated which could cause a large bloat in an intermediate token stream and corresponding increase in post-processing run-time on the processor. Additionally, any bit-oriented formats such as Deflate or LZS, where the literal is not on a byte boundary, but rather some set of n-bits that starts at some arbitrary bit offset in a byte (and could therefore straddle bytes) could pose an issue. Again, the bit-oriented format is even more problematic if the bits representing contiguous literals are scattered in the bit-stream. Note too that in Deflate the literals are Huffman encoded and therefore cannot be seen.

Detailed below are embodiments of systems, apparatuses, and methods to handle these other formats. A secondary output stream is generated by the hardware decompressor in addition to the token stream. Essentially the hardware also parses out the literals encoded possibly as bits at arbitrary positions in the compressed bit-stream, and writes the literal bytes out as a continuous literal-stream.

The hardware outputs are defined in exactly the same way regardless of what format it decompress. The token stream format will be identical, and Deflate would just have an additional literal byte-stream generated (whereas Snappy would not).

In addition to the format detailed above, a second format from the decompression hardware to the processor is defined that is optimized for some SIMD capable processors. Where the format defined above required only simple integer instructions with good performance; more capable processors can get greater speed-up with a different format.

Figure 7:
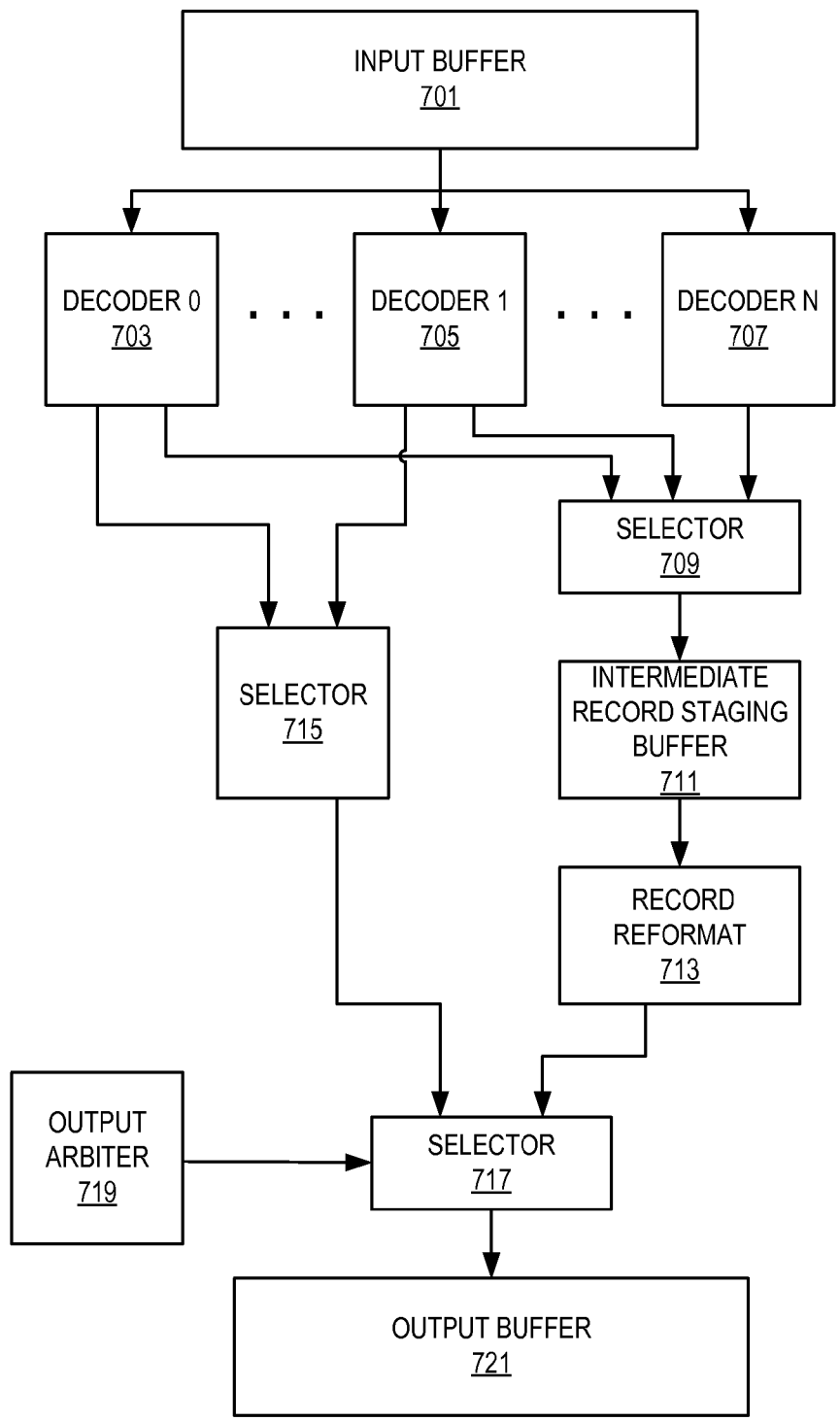
FIG. 7 illustrates an embodiment of a heterogeneous hardware decompressor.

FIG. 7 illustrates an embodiment of a heterogeneous hardware decompressor. This decompressor may be used as accelerator such as those found in FIGS. 1 and 2. In input buffer 701 receives compressed data streams to passes to one or more decoders (decoder 0 703, decoder 1 705, and decoder N 707). These decoders (or parsers) take that input data stream and generate intermediate records (or token) and/or literal streams.

Snappy and LZ4 decoders (decoder N 707) only generate a single output (intermediate records, which then get processed to form the token-stream), whereas decoders for Deflate (decoder 703) and LZS (decode 705) have an additional output (the byte-aligned literal stream These front-end decoders process input records from the compressed streams, turning them into intermediate records which are then reformatted into a final token-stream. Based on a desired configuration, one of two different types of token outputs may be generated for some SIMD-capable processors. Depending on the specific decompression algorithm, an input record may generate a single output token or multiple ones.

The decompressors each create an intermediate record that gets reformatted to a number of final output formats (e.g., in some embodiments two as detailed herein). The intermediate record either conveys information about a set of literal bytes, or a reference. One input record can result in exactly one intermediate record (normal operation of decoding Snappy, for instance). However, one input record can generate a number of intermediate records (e.g., a very large stored block of literals in Snappy format). Likewise, for efficiency of decoding formats such as Deflate, since each literal will be one input record, a decoder may bunch a set of these together to create a single intermediate record (for N literals). The intermediate record will usually contain information such as the start/end of current record in the input stream, whether the input stream is to be used or a special literal stream for extracting literals in software, etc., so that the decompressor hardware can know how the input stream is advancing, the literal stream is advancing and the output stream is advancing. And in all cases, references will be represented by length/distance-offsets.

Figure 10:
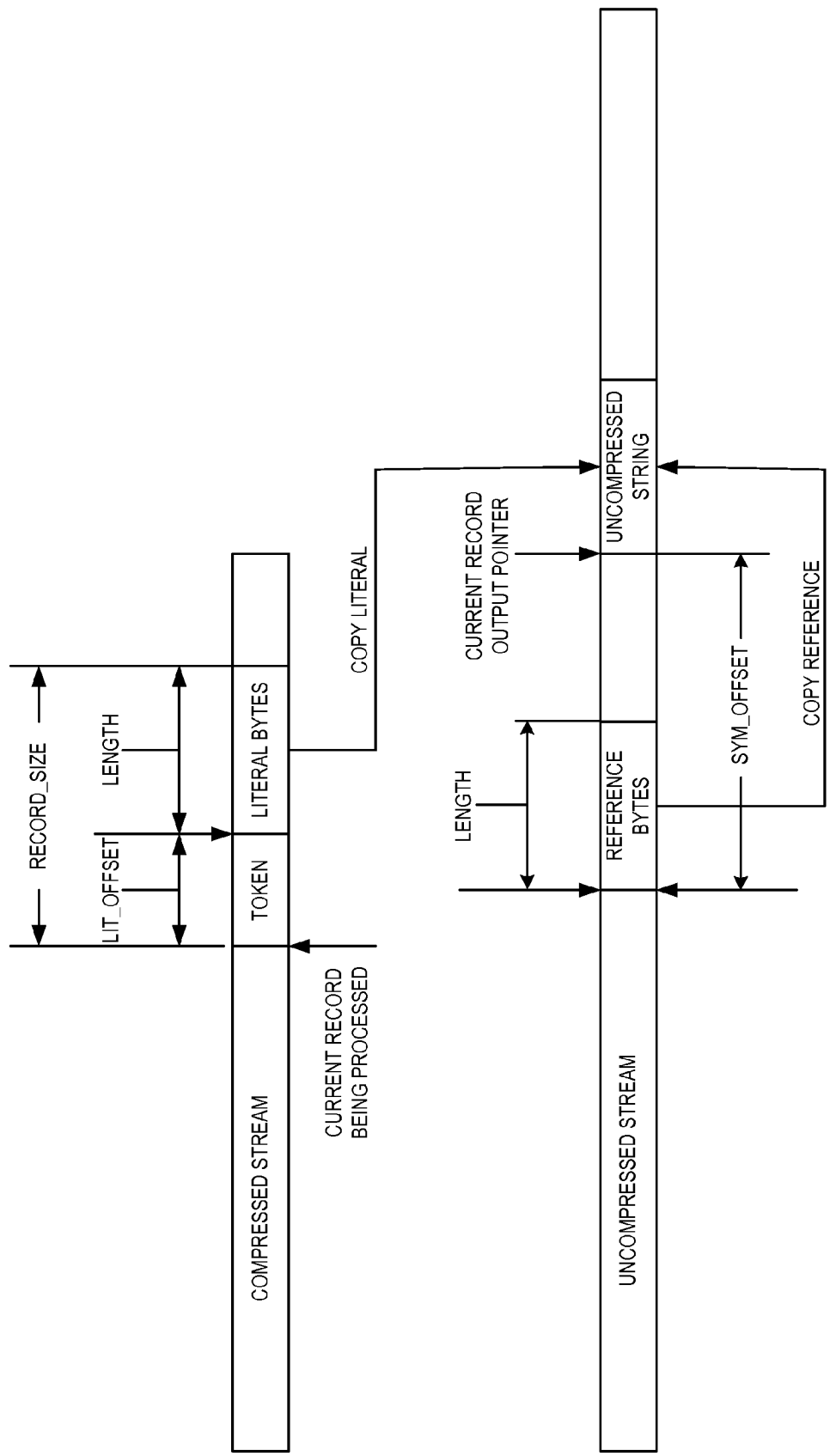
FIGS. 10-12 illustrate offsets and lengths specified in the intermediate format for different types of compression algorithms.
Figure 11:
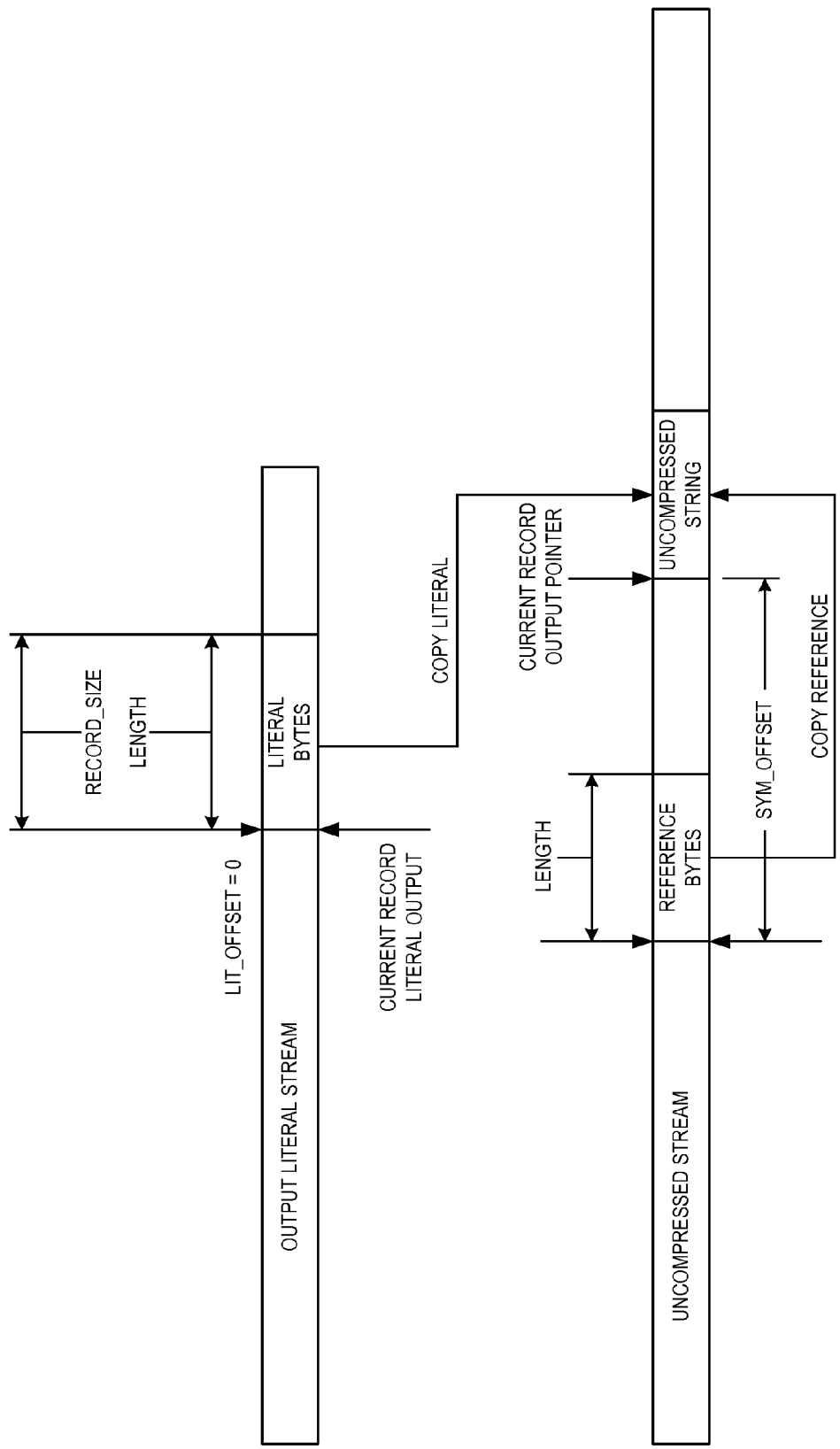
Figure 12:
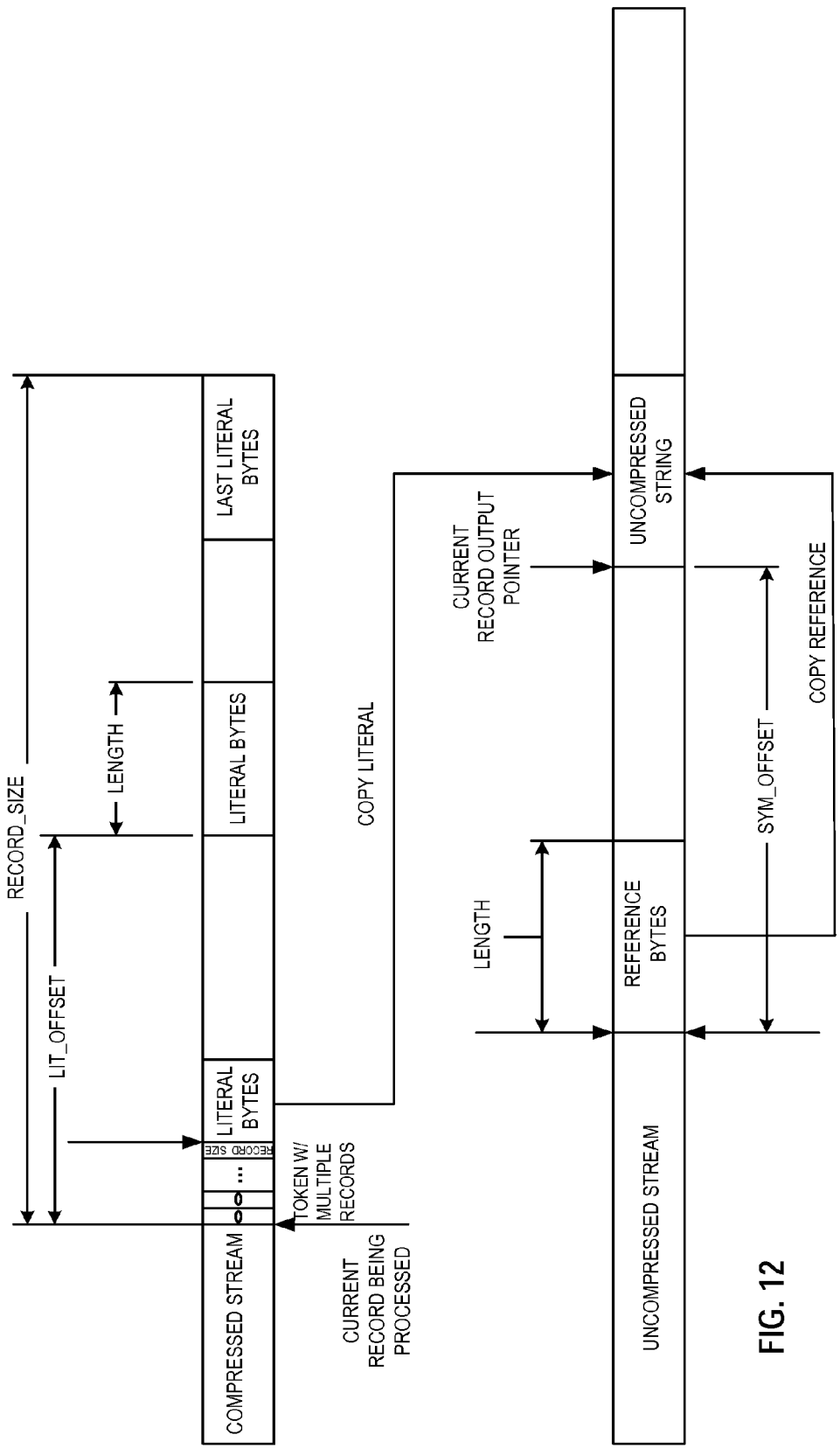

The offsets and lengths specified in the intermediate format for different types of compression algorithms, are depicted in the FIGS. 10-12. FIG. 10 shows a byte aligned single record such as found in Snappy or LZF. Each "input record" contains exactly one record, of either a literal or back reference. Also, the literal bytes are readily available in a byte aligned position in the compressed stream. FIG. 11 shows single record for a dedicated literal stream, such as found in LZS, LZSS, and DEFLATE. Each "input record" contains exactly one record, of either a literal or back reference. However, the literals are not readily available in a byte aligned position (e.g. LZS, LZSS) in the compressed stream and/or the literals are simply not available (e.g. Deflate). FIG. 12 shows byte aligned single record, such as found in LZRW, LZ4, and LZJB. Each "input record" is a group that contains multiple records, and literal bytes are readily available in a byte aligned position in the compressed stream. In each of the compression algorithms, literals come from the compressed stream.

A selector 709 is used to select between intermediate records, from the decoders, which are then buffered in intermediate record staging buffer 711. Record reformat circuitry 713 combines intermediate records into a single output token. In some formats, input records can be specified in groups. Some algorithms limit the length of literals for each record, in fact only one byte for Deflate. In such cases, the compressed stream could potentially have consecutive literal type records. Instead of outputting multiple output tokens of one byte literals, reformat circuitry 713 coalesces the multiple literal records into one output record. In some embodiments, 8 consecutive intermediate records are buffered in buffer 711, and the record reformat circuitry checks for any dependency from a reference record with a short offset that straddles the buffered records, and emit a full SIMD token (for fast-path) or single tokens (for slow path). These tokens are detailed below.

Selector 715 selects between literal outputs (715) and presents selected literals to selector 717 which selects between output of the record reformat circuitry 713 and literals based on input from an output arbitrator 719. An output buffer 721 holds selected literals and tokens for further processing.

As hinted at above, in some embodiments, there are two output token-stream formats. The first format is a fixed 40-bit token that was designed for efficient processing on any processor, using just simple integer instructions and was detailed above. A second token-stream format may also be generated to take advantage of some SIMD processors. In some embodiments, the formatting of the token is performed by record reformat circuitry 713.

In some embodiments, the decompressor buffers the most recent 8 literal or reference tokens, and checks whether there is any interdependency. Interdependency has very low probability, since each token generates on the average ~5 output bytes, and a dependency within this window implies a reference had a distance offset <5*8=40. Therefore, assuming no dependency, processing of 8 tokens at the same time can be done using quad-word lanes.

The second format has a fast and slow path (for the rare case of dependency within recent 8 tokens). FIG. 8 illustrates an embodiment of a fast and slow path token format. In the fast path format, a plurality of non-zero lengths 801 to 803 and source pointers 805 to 807 are provided. Typically, the 8 "lengths" are each 8-bit in size and is bit position represented (length assumed in the range 1 through 8). This is essentially a mask to be used for vector compression. In other words, the length says how many bytes of a data are to be copied. The 8 quadword (64-bit) pointers are used for quadword gather and provide the source addresses for the literals or reference copies.

The slow path uses a 0 in the first byte 809 as an escape byte. The length 811 may be up to 255. A source address for the copy is proved in pointer 813.

Figure 9:
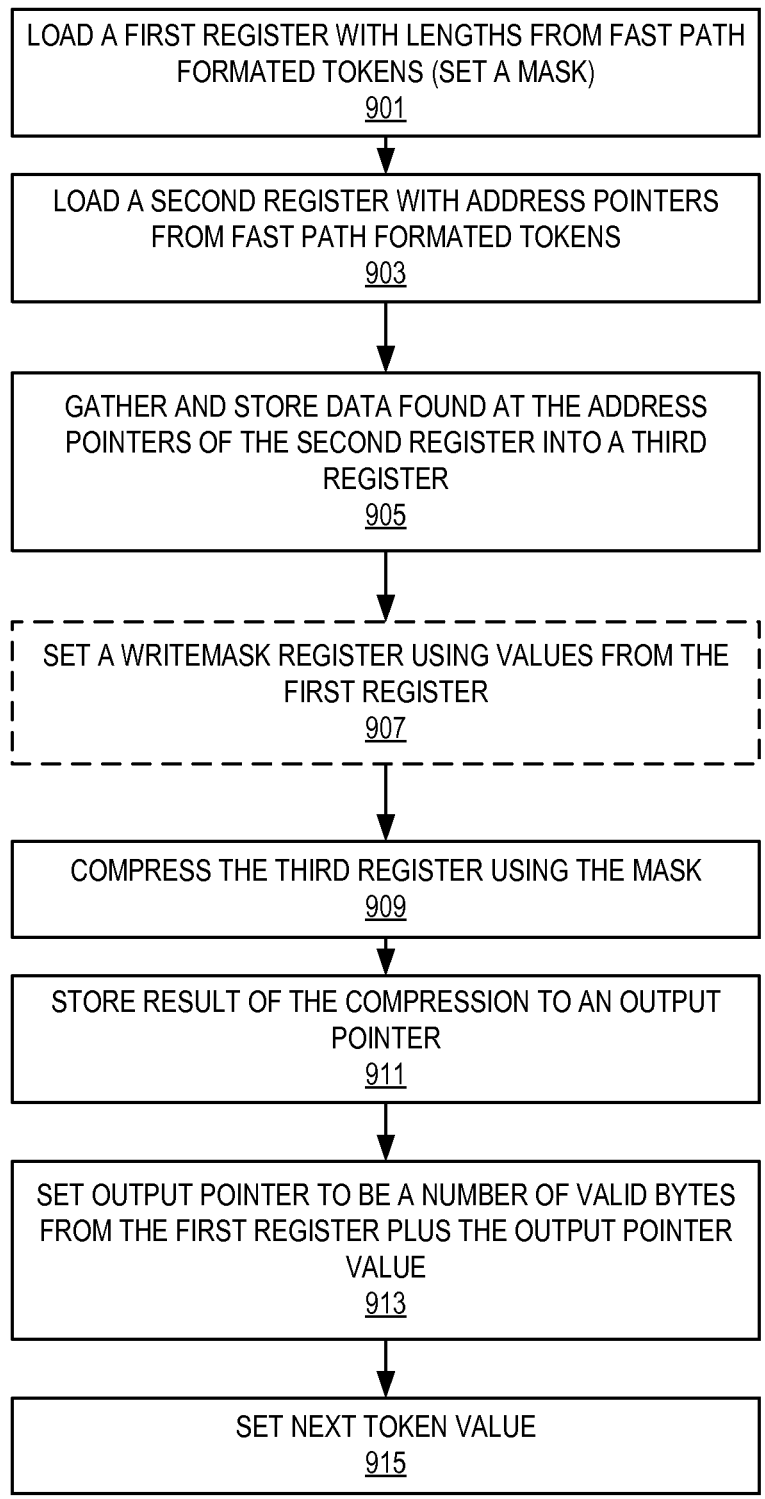
FIG. 9 illustrates an embodiment of a fast path processing flow on a processor supporting the second token type.

FIG. 9 illustrates an embodiment of a fast path processing flow on a processor supporting the second token type. In particular, the processor is to process the most recent literal or reference tokens (such as 8 tokens) that are in the second format as shown in FIG. 8. In some embodiments, a determination of if the fast processing path or slow path is to be used. This is done by checking the first byte of a set of received tokens in the second format to see if it is zero. When it is, then slow path is used, else fast path is used as detailed herein.

At 901, a first register is loaded with the lengths from the fast path format. In some embodiments, this is the first 8 tokens which are shown as lengths in FIG. 8. Typically, this register is a 64-bit general purpose register, however, other register sizes and types may be used.

A second register is loaded with the source pointers of the received tokens at 903. Looking at 8, these are the pointers 805-07. Typically, the second register is a 512-bit packed data (or vector) register. The pointers are "gather" pointers which provide addresses for literal or reference copies of an input stream.

At 905, a third register is loaded with data, wherein the data is found at the location of the pointers of the second register. Typically, 8 bytes are loaded from each location into a 512-bit packed data (or vector) register.

In some embodiments, a special writemask register (e.g., k-mask) is set with the 64-bits of the first register at 907. This sets the masks of what to grab from the third register.

A compression of the data in the third register using one of the first or writemask register as a mask is made at 909. This compresses the data of the third register of what is "good." The result is stored to an output pointer at 911.

In some embodiments, the output pointer is set to be a number of valid bits (those set to 1) in the first register plus the output pointer value of 911. The output pointer is advanced by the number of valid bytes written (by the SIMD compress operation). Any offset used in subsequent references will need to work backwards from the updated output pointer. Additionally, in some embodiments, the token group of tokens is queued up for processing at 915.

In pseudo-code, the fast path flow on a processor according to an embodiment is:

```
If (token[0] !=0){
load a 64-bit register RK = token[7:0]
load a ZMM1 register with next 64 bytes, representing 8 gather pointers
Gather 8-bytes per token, for the 8 tokens (using the 8 addresses) into
ZMM2
Set k-registers using KMOVQ that moves 64-bits from RK
Vcompressb on gathered data in ZMM2 with k-mask above
Store result to output pointer (note, regular unaligned store, NOT scatter)
Output-pointer += popcnt(RK); token += 72;
}
```

The above allows for lossless compression used in many diverse applications, and many large entities (e.g. database, storage and networking applications) are increasingly interested in speeding up compression/decompression as it is very compute intensive. Numerous mass-market uses for which faster decompression include webservers, input/output optimization in compressed file systems, and Snappy compression/decompression in Hadoop.

In some embodiments, an exact same post-processing software routine may be used to handle the seemingly disparate cases of a format that generates an extra literal stream, and one that does not. When there is an extra literal stream, one input to the software routine is the pointer of the literal stream generated by the hardware (as detailed above), whereas in the latter case, the software is passed a pointer to the original compressed stream. Note that extra streams are created by decoder 0 703 and decoder 1 705 (e.g., DEFLATE and LZS) and shown in FIG. 11.

Detailed below are exemplary core architectures, processors, and architectures that may utilize the above described embodiments.

Write mask registers 1315—in the embodiment illustrated, there are 8 write mask registers (k0 through k7), each 64 bits in size. In an alternate embodiment, the write mask registers 1315 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 1325—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1345, on which is aliased the MMX packed integer flat register file 1350—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 14A is a block diagram illustrating both an exemplary in-order pipeline and an exemplary register renaming, out-of-order issue/execution pipeline according to embodiments of the invention. FIG. 14B is a block diagram illustrating both an exemplary embodiment of an in-order architecture core and an exemplary register renaming, out-of-order issue/execution architecture core to be included in a processor according to embodiments of the invention. The solid lined boxes in FIGS. 14A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 14A, a processor pipeline 1400 includes a fetch stage 1402, a length decode stage 1404, a decode stage 1406, an allocation stage 1408, a renaming stage 1410, a scheduling (also known as a dispatch or issue) stage 1412, a register read/memory read stage 1414, an execute stage 1416, a write back/memory write stage 1418, an exception handling stage 1422, and a commit stage 1424.

FIG. 14B shows processor core 1490 including a front end unit 1430 coupled to an execution engine unit 1450, and both are coupled to a memory unit 1470. The core 1490 may be a reduced instruction set computing (RISC) core, a complex instruction set computing (CISC) core, a very long instruction word (VLIW) core, or a hybrid or alternative core type. As yet another option, the core 1490 may be a special-purpose core, such as, for example, a network or communication core, compression engine, coprocessor core, general purpose computing graphics processing unit (GPGPU) core, graphics core, or the like.

The front end unit 1430 includes a branch prediction unit 1432 coupled to an instruction cache unit 1434, which is coupled to an instruction translation lookaside buffer (TLB) 1436, which is coupled to an instruction fetch unit 1438, which is coupled to a decode unit 1440. The decode unit 1440 (or decoder) may decode instructions, and generate as an output one or more micro-operations, microcode entry points, microinstructions, other instructions, or other control signals, which are decoded from, or which otherwise reflect, or are derived from, the original instructions. The decode unit 1440 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1490 includes a microcode ROM or other medium that stores microcode for certain macroinstructions (e.g., in decode unit 1440 or otherwise within the front end unit 1430). The decode unit 1440 is coupled to a rename/allocator unit 1452 in the execution engine unit 1450.

The execution engine unit 1450 includes the rename/allocator unit 1452 coupled to a retirement unit 1454 and a set of one or more scheduler unit(s) 1456. The scheduler unit(s) 1456 represents any number of different schedulers, including reservations stations, central instruction window, etc. The scheduler unit(s) 1456 is coupled to the physical register file(s) unit(s) 1458. Each of the physical register file(s) units 1458 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1458 comprises a vector registers unit, a write mask registers unit, and a scalar registers unit. These register units may provide architectural vector registers, vector mask registers, and general purpose registers. The physical register file(s) unit(s) 1458 is overlapped by the retirement unit 1454 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1454 and the physical register file(s) unit(s) 1458 are coupled to the execution cluster(s) 1460. The execution cluster(s) 1460 includes a set of one or more execution units 1462 and a set of one or more memory access units 1464. The execution units 1462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1456, physical register file(s) unit(s) 1458, and execution cluster(s) 1460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1464). It should also be understood that where separate pipelines are used, one or more of these pipelines may be out-of-order issue/execution and the rest in-order.

The set of memory access units 1464 is coupled to the memory unit 1470, which includes a data TLB unit 1472 coupled to a data cache unit 1474 coupled to a level 2 (L2) cache unit 1476. In one exemplary embodiment, the memory access units 1464 may include a load unit, a store address unit, and a store data unit, each of which is coupled to the data TLB unit 1472 in the memory unit 1470. The instruction cache unit 1434 is further coupled to a level 2 (L2) cache unit 1476 in the memory unit 1470. The L2 cache unit 1476 is coupled to one or more other levels of cache and eventually to a main memory.

By way of example, the exemplary register renaming, out-of-order issue/execution core architecture may implement the pipeline 1400 as follows: 1) the instruction fetch 1438 performs the fetch and length decoding stages 1402 and 1404; 2) the decode unit 1440 performs the decode stage 1406; 3) the rename/allocator unit 1452 performs the allocation stage 1408 and renaming stage 1410; 4) the scheduler unit(s) 1456 performs the schedule stage 1412; 5) the physical register file(s) unit(s) 1458 and the memory unit 1470 perform the register read/memory read stage 1414; the execution cluster 1460 perform the execute stage 1416; 6) the memory unit 1470 and the physical register file(s) unit(s) 1458 perform the write back/memory write stage 1418; 7) various units may be involved in the exception handling stage 1422; and 8) the retirement unit 1454 and the physical register file(s) unit(s) 1458 perform the commit stage 1424.

The core 1490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1490 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1434/1474 and a shared L2 cache unit 1476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 15B:
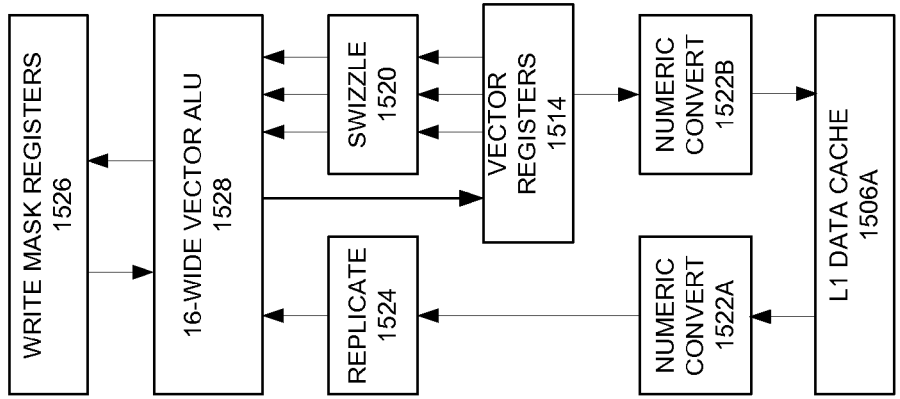
FIGS. 15A-B illustrate a block diagram of a more specific exemplary in-order core architecture, which core would be one of several logic blocks (including other cores of the same type and/or different types) in a chip.
Figure 15A:
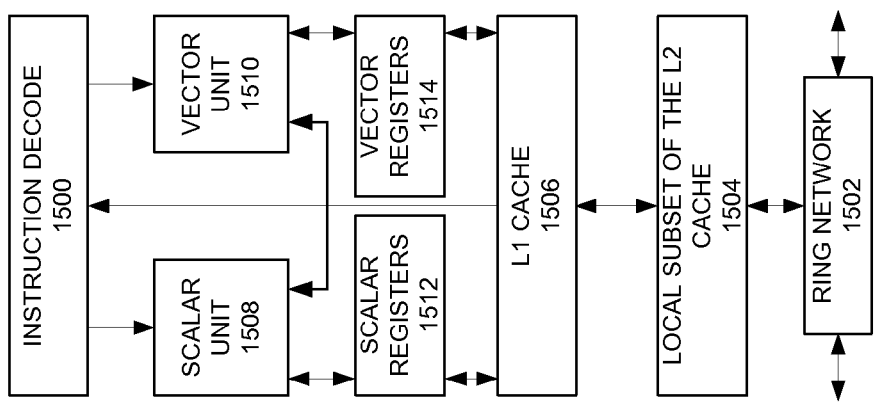

FIGS. 15A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 15A is a block diagram of a single processor core, along with its connection to the on-die interconnect network 1502 and with its local subset of the Level 2 (L2) cache 1504, according to embodiments of the invention. In one embodiment, an instruction decoder 1500 supports the x86 instruction set with a packed data instruction set extension. An L1 cache 1506 allows low-latency accesses to cache memory into the scalar and vector units. While in one embodiment (to simplify the design), a scalar unit 1508 and a vector unit 1510 use separate register sets (respectively, scalar registers 1512 and vector registers 1514) and data transferred between them is written to memory and then read back in from a level 1 (L1) cache 1506, alternative embodiments of the invention may use a different approach (e.g., use a single register set or include a communication path that allow data to be transferred between the two register files without being written and read back).

The local subset of the L2 cache 1504 is part of a global L2 cache that is divided into separate local subsets, one per processor core. Each processor core has a direct access path to its own local subset of the L2 cache 1504. Data read by a processor core is stored in its L2 cache subset 1504 and can be accessed quickly, in parallel with other processor cores accessing their own local L2 cache subsets. Data written by a processor core is stored in its own L2 cache subset 1504 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 15B is an expanded view of part of the processor core in FIG. 15A according to embodiments of the invention. FIG. 15B includes an L1 data cache 1506A part of the L1 cache 1504, as well as more detail regarding the vector unit 1510 and the vector registers 1514. Specifically, the vector unit 1510 is a 16-wide vector processing unit (VPU) (see the 16-wide ALU 1528), which executes one or more of integer, single-precision float, and double-precision float instructions. The VPU supports swizzling the register inputs with swizzle unit 1520, numeric conversion with numeric convert units 1522A-B, and replication with replication unit 1524 on the memory input. Write mask registers 1526 allow predicating resulting vector writes.

Processor with Integrated Memory Controller and Graphics

Figure 16:
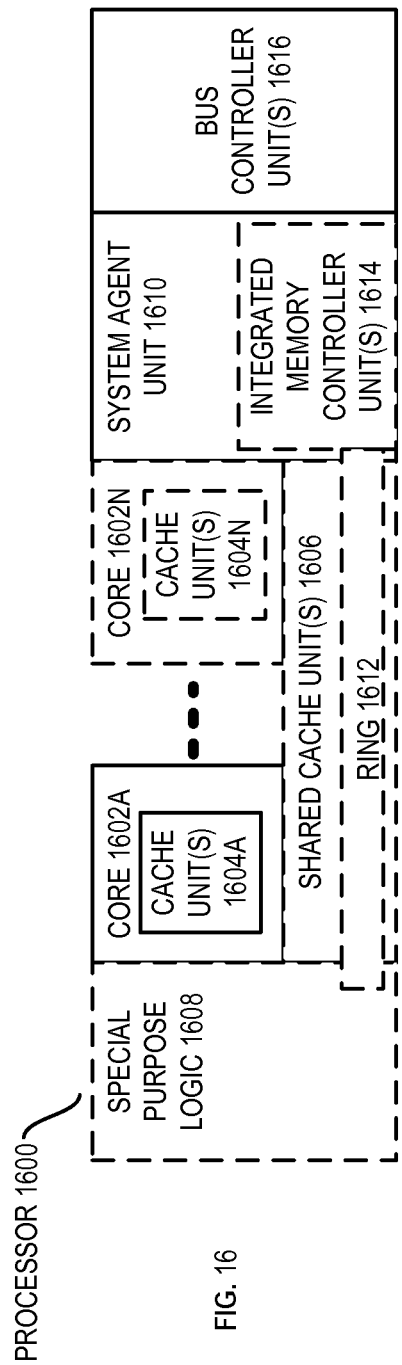
FIG. 16 is a block diagram of a processor 1600 that may have more than one core, may have an integrated memory controller, and may have integrated graphics according to embodiments of the invention.

FIG. 16 is a block diagram of a processor 1600 that may have more than one core, may have an integrated memory controller, and may have integrated graphics according to embodiments of the invention. The solid lined boxes in FIG. 16 illustrate a processor 1600 with a single core 1602A, a system agent 1610, a set of one or more bus controller units 1616, while the optional addition of the dashed lined boxes illustrates an alternative processor 1600 with multiple cores 1602A-N, a set of one or more integrated memory controller unit(s) 1614 in the system agent unit 1610, and special purpose logic 1608.

Thus, different implementations of the processor 1600 may include: 1) a CPU with the special purpose logic 1608 being integrated graphics and/or scientific (throughput) logic (which may include one or more cores), and the cores 1602A-N being one or more general purpose cores (e.g., general purpose in-order cores, general purpose out-of-order cores, a combination of the two); 2) a coprocessor with the cores 1602A-N being a large number of special purpose cores intended primarily for graphics and/or scientific (throughput); and 3) a coprocessor with the cores 1602A-N being a large number of general purpose in-order cores. Thus, the processor 1600 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1606, and external memory (not shown) coupled to the set of integrated memory controller units 1614. The set of shared cache units 1606 may include one or more mid-level caches, such as level 2 (L2), level 3 (L3), level 4 (L4), or other levels of cache, a last level cache (LLC), and/or combinations thereof. While in one embodiment a ring based interconnect unit 1612 interconnects the integrated graphics logic 1608, the set of shared cache units 1606, and the system agent unit 1610/integrated memory controller unit(s) 1614, alternative embodiments may use any number of well-known techniques for interconnecting such units. In one embodiment, coherency is maintained between one or more cache units 1606 and cores 1602-A-N.

In some embodiments, one or more of the cores 1602A-N are capable of multithreading. The system agent 1610 includes those components coordinating and operating cores 1602A-N. The system agent unit 1610 may include for example a power control unit (PCU) and a display unit. The PCU may be or include logic and components needed for regulating the power state of the cores 1602A-N and the integrated graphics logic 1608. The display unit is for driving one or more externally connected displays.

The cores 1602A-N may be homogenous or heterogeneous in terms of architecture instruction set; that is, two or more of the cores 1602A-N may be capable of execution the same instruction set, while others may be capable of executing only a subset of that instruction set or a different instruction set.

Exemplary Computer Architectures

FIGS. 17-20 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 17:
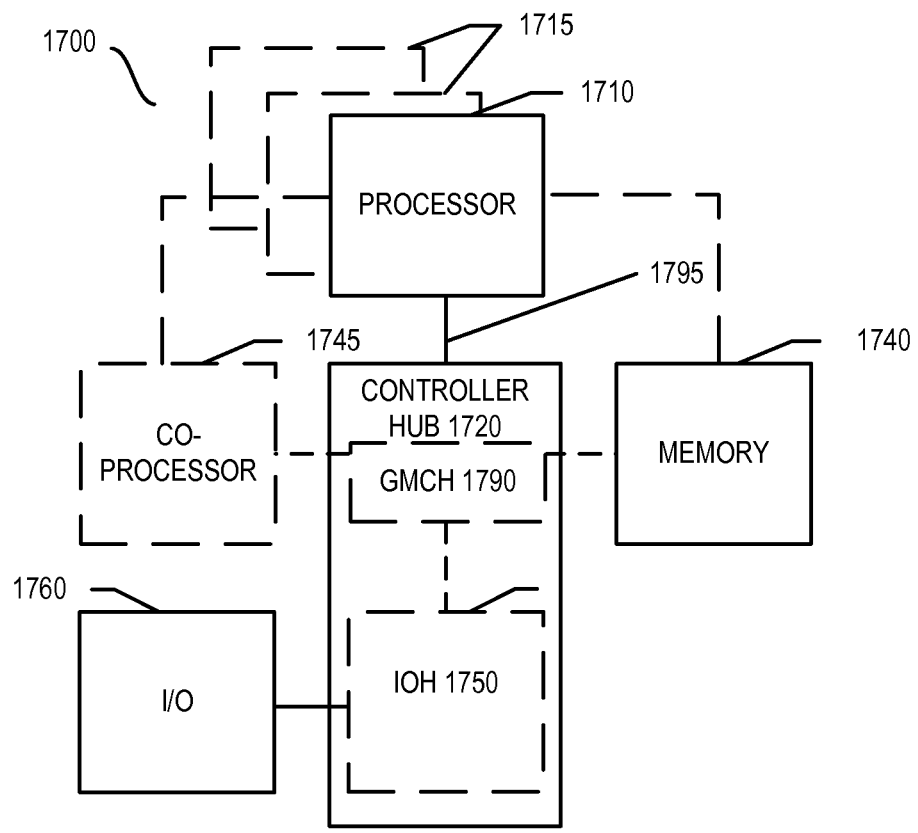
FIGS. 17-20 are block diagrams of exemplary computer architectures.

Referring now to FIG. 17, shown is a block diagram of a system 1700 in accordance with one embodiment of the present invention. The system 1700 may include one or more processors 1710, 1715, which are coupled to a controller hub 1720. In one embodiment the controller hub 1720 includes a graphics memory controller hub (GMCH) 1790 and an Input/Output Hub (IOH) 1750 (which may be on separate chips); the GMCH 1790 includes memory and graphics controllers to which are coupled memory 1740 and a coprocessor 1745; the IOH 1750 is couples input/output (I/O) devices 1760 to the GMCH 1790. Alternatively, one or both of the memory and graphics controllers are integrated within the processor (as described herein), the memory 1740 and the coprocessor 1745 are coupled directly to the processor 1710, and the controller hub 1720 in a single chip with the IOH 1750.

The optional nature of additional processors 1715 is denoted in FIG. 17 with broken lines. Each processor 1710, 1715 may include one or more of the processing cores described herein and may be some version of the processor 1600.

The memory 1740 may be, for example, dynamic random access memory (DRAM), phase change memory (PCM), or a combination of the two. For at least one embodiment, the controller hub 1720 communicates with the processor(s) 1710, 1715 via a multi-drop bus, such as a frontside bus (FSB), point-to-point interface such as QuickPath Interconnect (QPI), or similar connection 1795.

In one embodiment, the coprocessor 1745 is a special-purpose processor, such as, for example, a high-throughput MIC processor, a network or communication processor, compression engine, graphics processor, GPGPU, embedded processor, or the like. In one embodiment, controller hub 1720 may include an integrated graphics accelerator.

There can be a variety of differences between the physical resources 1710, 1715 in terms of a spectrum of metrics of merit including architectural, microarchitectural, thermal, power consumption characteristics, and the like.

In one embodiment, the processor 1710 executes instructions that control data processing operations of a general type. Embedded within the instructions may be coprocessor instructions. The processor 1710 recognizes these coprocessor instructions as being of a type that should be executed by the attached coprocessor 1745. Accordingly, the processor 1710 issues these coprocessor instructions (or control signals representing coprocessor instructions) on a coprocessor bus or other interconnect, to coprocessor 1745. Coprocessor(s) 1745 accept and execute the received coprocessor instructions.

Figure 18:
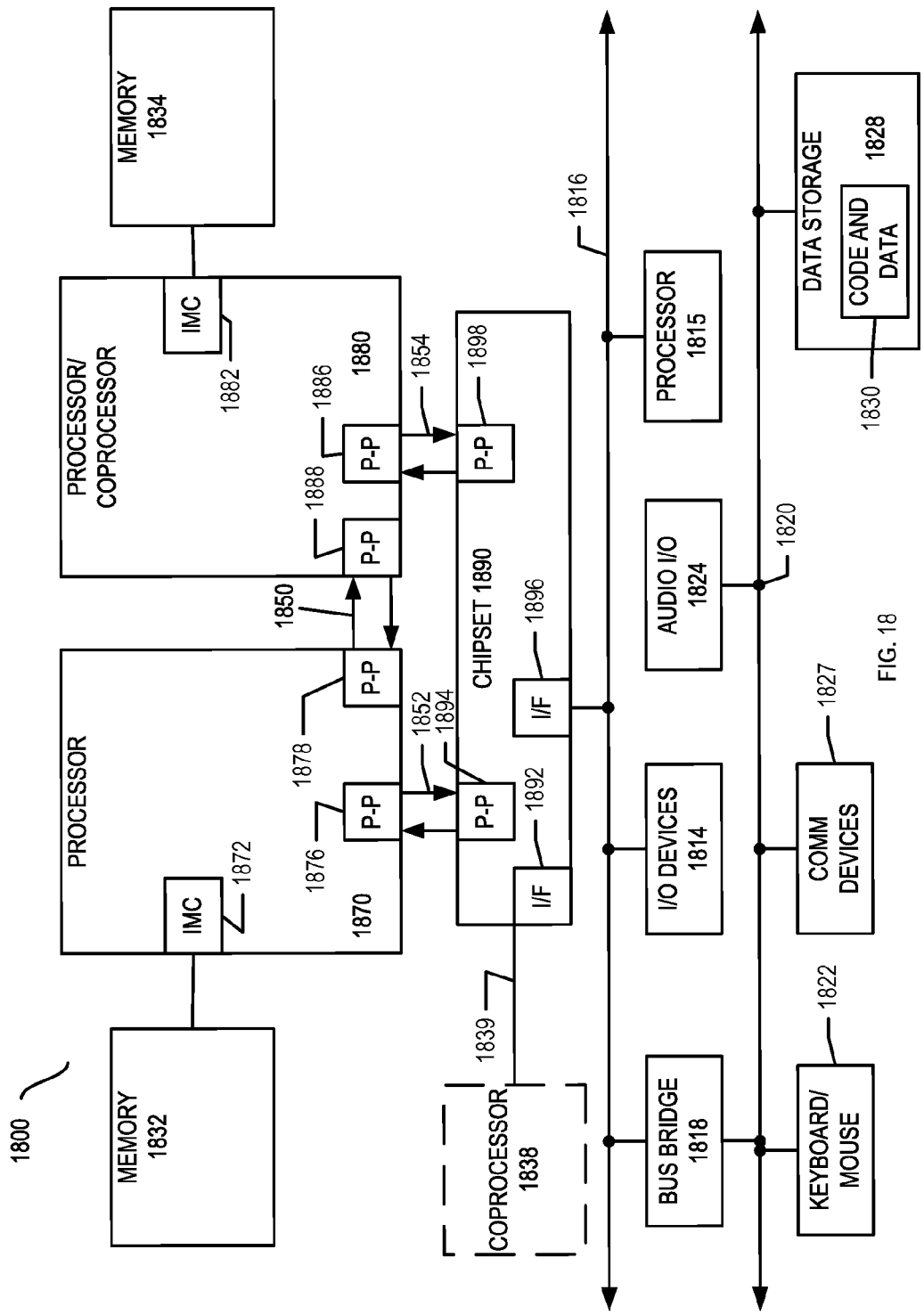

Referring now to FIG. 18, shown is a block diagram of a first more specific exemplary system 1800 in accordance with an embodiment of the present invention. As shown in FIG. 18, multiprocessor system 1800 is a point-to-point interconnect system, and includes a first processor 1870 and a second processor 1880 coupled via a point-to-point interconnect 1850. Each of processors 1870 and 1880 may be some version of the processor 1600. In one embodiment of the invention, processors 1870 and 1880 are respectively processors 1710 and 1715, while coprocessor 1838 is coprocessor 1745. In another embodiment, processors 1870 and 1880 are respectively processor 1710 coprocessor 1745.

Processors 1870 and 1880 are shown including integrated memory controller (IMC) units 1872 and 1882, respectively. Processor 1870 also includes as part of its bus controller units point-to-point (P-P) interfaces 1876 and 1878; similarly, second processor 1880 includes P-P interfaces 1886 and 1888. Processors 1870, 1880 may exchange information via a point-to-point (P-P) interface 1850 using P-P interface circuits 1878, 1888. As shown in FIG. 18, IMCs 1872 and 1882 couple the processors to respective memories, namely a memory 1832 and a memory 1834, which may be portions of main memory locally attached to the respective processors.

Processors 1870, 1880 may each exchange information with a chipset 1890 via individual P-P interfaces 1852, 1854 using point to point interface circuits 1876, 1894, 1886, 1898. Chipset 1890 may optionally exchange information with the coprocessor 1838 via a high-performance interface 1839. In one embodiment, the coprocessor 1838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1890 may be coupled to a first bus 1816 via an interface 1896. In one embodiment, first bus 1816 may be a Peripheral Component Interconnect (PCI) bus, or a bus such as a PCI Express bus or another third generation I/O interconnect bus, although the scope of the present invention is not so limited.

As shown in FIG. 18, various I/O devices 1814 may be coupled to first bus 1816, along with a bus bridge 1818 which couples first bus 1816 to a second bus 1820. In one embodiment, one or more additional processor(s) 1815, such as coprocessors, high-throughput MIC processors, GPGPU's, accelerators (such as, e.g., graphics accelerators or digital signal processing (DSP) units), field programmable gate arrays, or any other processor, are coupled to first bus 1816. In one embodiment, second bus 1820 may be a low pin count (LPC) bus. Various devices may be coupled to a second bus 1820 including, for example, a keyboard and/or mouse 1822, communication devices 1827 and a storage unit 1828 such as a disk drive or other mass storage device which may include instructions/code and data 1830, in one embodiment. Further, an audio I/O 1824 may be coupled to the second bus 1820. Note that other architectures are possible. For example, instead of the point-to-point architecture of FIG. 18, a system may implement a multi-drop bus or other such architecture.

Figure 19:
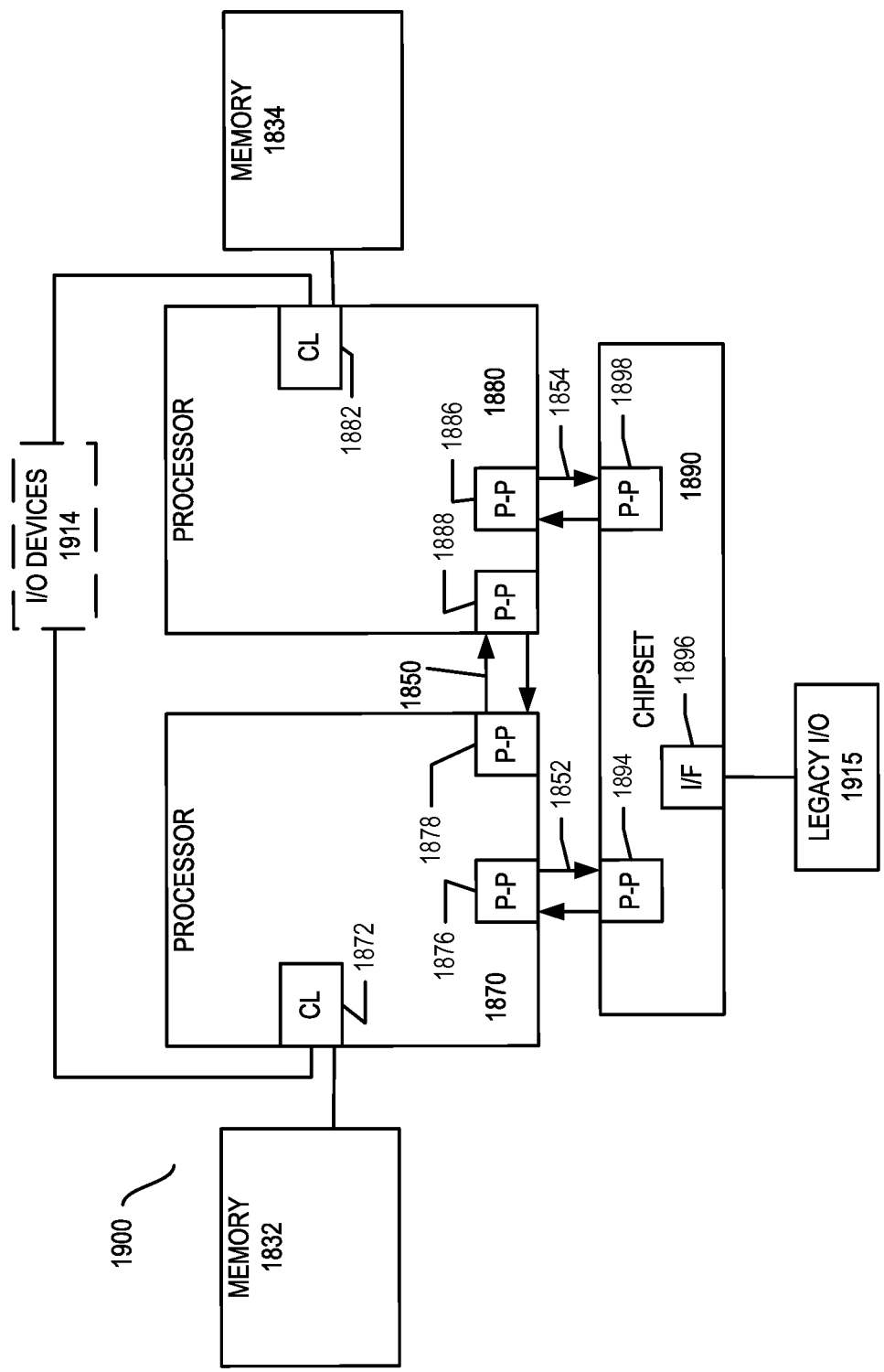

Referring now to FIG. 19, shown is a block diagram of a second more specific exemplary system 1900 in accordance with an embodiment of the present invention. Like elements in FIGS. 18 and 19 bear like reference numerals, and certain aspects of FIG. 18 have been omitted from FIG. 19 in order to avoid obscuring other aspects of FIG. 19.

FIG. 19 illustrates that the processors 1870, 1880 may include integrated memory and I/O control logic ("CL") 1872 and 1882, respectively. Thus, the CL 1872, 1882 include integrated memory controller units and include I/O control logic. FIG. 19 illustrates that not only are the memories 1832, 1834 coupled to the CL 1872, 1882, but also that I/O devices 1914 are also coupled to the control logic 1872, 1882. Legacy I/O devices 1915 are coupled to the chipset 1890.

Figure 20:
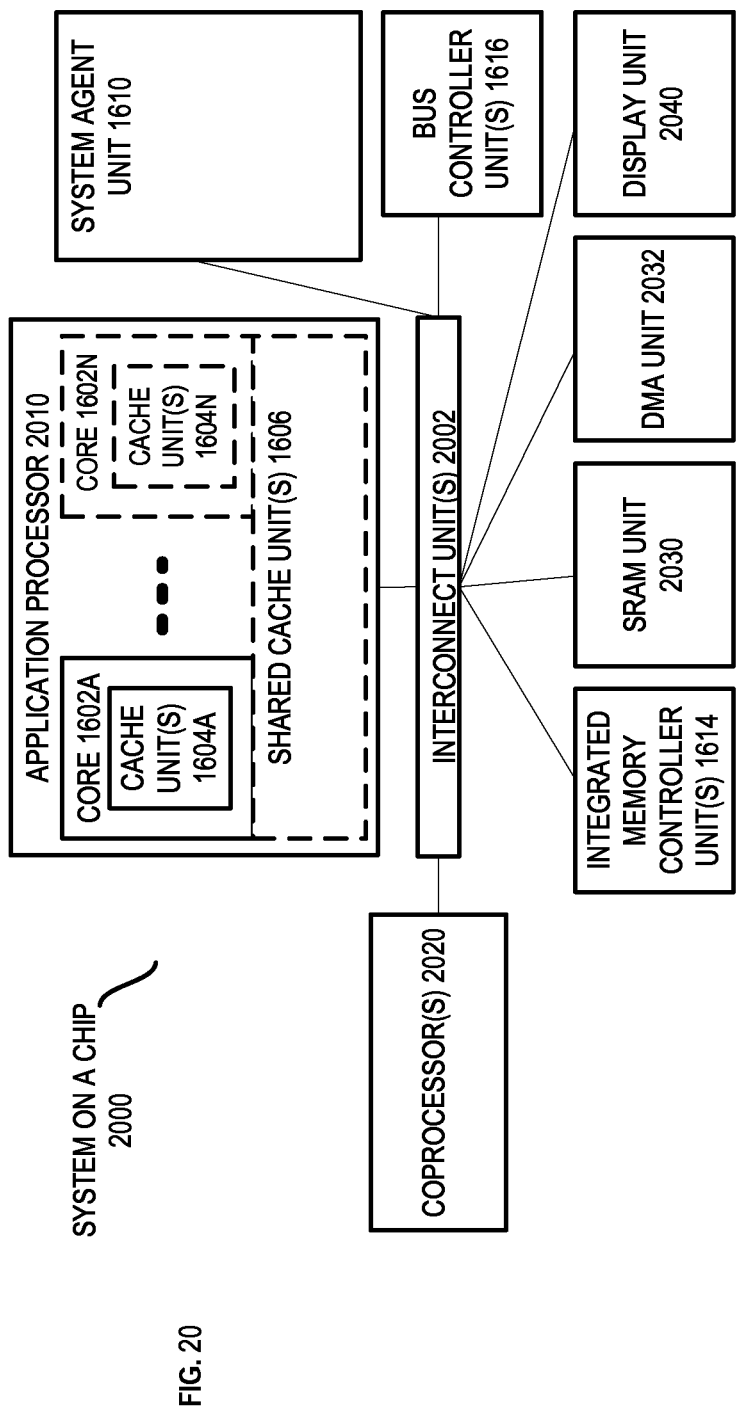

Referring now to FIG. 20, shown is a block diagram of a SoC 2000 in accordance with an embodiment of the present invention. Similar elements in FIG. 16 bear like reference numerals. Also, dashed lined boxes are optional features on more advanced SoCs. In FIG. 20, an interconnect unit(s) 2002 is coupled to: an application processor 2010 which includes a set of one or more cores 202A-N and shared cache unit(s) 1606; a system agent unit 1610; a bus controller unit(s) 1616; an integrated memory controller unit(s) 1614; a set or one or more coprocessors 2020 which may include integrated graphics logic, an image processor, an audio processor, and a video processor; an static random access memory (SRAM) unit 2030; a direct memory access (DMA) unit 2032; and a display unit 2040 for coupling to one or more external displays. In one embodiment, the coprocessor(s) 2020 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1830 illustrated in FIG. 18, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (including binary translation, code morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 21 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 21 shows a program in a high level language 2102 may be compiled using an x86 compiler 2104 to generate x86 binary code 2106 that may be natively executed by a processor with at least one x86 instruction set core 2116. The processor with at least one x86 instruction set core 2116 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2104 represents a compiler that is operable to generate x86 binary code 2106 (e.g., object code) that can, with or without additional linkage processing, be executed on the processor with at least one x86 instruction set core 2116. Similarly, FIG. 21 shows the program in the high level language 2102 may be compiled using an alternative instruction set compiler 2108 to generate alternative instruction set binary code 2110 that may be natively executed by a processor without at least one x86 instruction set core 2114 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2112 is used to convert the x86 binary code 2106 into code that may be natively executed by the processor without an x86 instruction set core 2114. This converted code is not likely to be the same as the alternative instruction set binary code 2110 because an instruction converter capable of this is difficult to make; however, the converted code will accomplish the general operation and be made up of instructions from the alternative instruction set. Thus, the instruction converter 2112 represents software, firmware, hardware, or a combination thereof that, through emulation, simulation or any other process, allows a processor or other electronic device that does not have an x86 instruction set processor or core to execute the x86 binary code 2106.

What is claimed is:

1. A hardware apparatus comprising:
an input buffer to store incoming input records from a compressed stream having literal bytes and pointers to replicated strings;
a plurality of decoders, each decoder to decode at least one input record from the input buffer and output an intermediate record from the decoded data and a subset of the plurality of decoders to output a stream of literals;
a reformat circuit to format an intermediate record into one of two types of tokens, wherein the first type of token is to include eight non-zero lengths and eight source pointers, and the second type of token is to include an escape byte, a length, and a source address.

2. The hardware apparatus of claim 1, wherein a first of the plurality of decoders is to decode according to the DEFLATE compression algorithm and output a byte-aligned literal stream of literals that were Huffman encoded.

3. The hardware apparatus of claim 2, wherein the intermediate record includes at least one of a set of literals, information on a number of literals of the intermediate record, and information about a reference.

4. The hardware apparatus of claim 1, wherein a second of the plurality of decoders is to generate an intermediate record per input record.

5. The hardware apparatus of claim 1, a third of the plurality of decoders is to generate a single intermediate record from a plurality of input records.

6. The hardware apparatus of claim 1, wherein a fourth of the plurality of decoders is to generate a plurality of intermediate records from a single input record.

7. The hardware apparatus of claim 1, wherein a given decoder is to generate one of a single intermediate record per input record, a plurality of intermediate records per input record, and a single intermediate record per plurality of input records depending upon content provided to the decoder.

8. The hardware apparatus of claim 1, wherein the apparatus is external to a processor core.

9. The hardware apparatus of claim 1, further comprising:
an intermediate record staging buffer to buffer consecutive intermediate records, wherein the reformat circuit to format the tokens by checking for any dependency from a reference record with an offset that straddles the buffered consecutive intermediate records, and generate the first type of type of token for a fast-path use or a second type of token for the slow path.

10. The hardware apparatus of claim 1, wherein the compressed stream is a LZ77 stream.

11. The hardware apparatus of claim 9, wherein the slow path does not use hardware acceleration.

12. The hardware apparatus of claim 1, wherein the lengths of the first type of token are 8 bits in size.

13. The hardware apparatus of claim 1, wherein the lengths of the first type of token are 8 bits in size.

14. The hardware apparatus of claim 1, wherein the lengths of the first type of token are bit position represented.

15. The hardware apparatus of claim 1, wherein the lengths of the first type of token are 64 bits in size.

16. The hardware apparatus of claim 1, further comprising:
single instruction, multiple data circuitry to parallelly process bytes per token.

* * * * *